(12) United States Patent
Tsutsumi et al.

(10) Patent No.: US 7,423,365 B2
(45) Date of Patent: Sep. 9, 2008

(54) SURFACE ACOUSTIC WAVE DEVICE

(75) Inventors: Jun Tsutsumi, Kawasaki (JP); Shogo Inoue, Kawasaki (JP); Masanori Ueda, Yokohama (JP)

(73) Assignees: Fujitsu Media Devices Limited, Yokohama (JP); Fujitsu Limited, Kawasaki (JP)

( * ) Notice: Subject to any disclaimer, the term of this patent is extended or adjusted under 35 U.S.C. 154(b) by 440 days.

(21) Appl. No.: 11/139,040

(22) Filed: May 27, 2005

(65) Prior Publication Data

US 2005/0264136 A1   Dec. 1, 2005

(30) Foreign Application Priority Data

May 31, 2004   (JP)   ............................. 2004-162611

(51) Int. Cl.
   *H01L 41/08*   (2006.01)
(52) U.S. Cl. ................ 310/364; 310/313 A; 310/313 R
(58) Field of Classification Search ............ 310/313 A, 310/364
   See application file for complete search history.

(56) References Cited

U.S. PATENT DOCUMENTS

| | | |
|---|---|---|
| 4,906,885 A | 3/1990 | Kojima et al. |
| 5,909,156 A | 6/1999 | Nishihara et al. |
| 6,259,185 B1 * | 7/2001 | Lai ......................... 310/313 B |
| 6,297,580 B1 | 10/2001 | Takayama et al. |
| 6,486,591 B2 * | 11/2002 | Nishihara ................... 310/364 |
| 6,822,371 B2 * | 11/2004 | Nakagawara et al. ... 310/313 R |
| 6,965,190 B2 * | 11/2005 | Tanuma et al. .............. 310/363 |

FOREIGN PATENT DOCUMENTS

| | | |
|---|---|---|
| CN | 1263646 A | 8/2000 |
| JP | 62-163408 A | 7/1987 |
| JP | 64-80113 A | 3/1989 |
| JP | 4-288718 A | 10/1992 |
| JP | 5-90268 A | 4/1993 |
| JP | 5-206776 A | 8/1993 |
| JP | 6-6173 A | 1/1994 |
| JP | 7-122961 A | 5/1995 |
| JP | 8-32404 A | 2/1996 |
| JP | 8-148966 A | 6/1996 |
| JP | 9-223944 A | 8/1997 |
| JP | 10-93368 A | 4/1998 |
| JP | 2002-368568 A | 12/2002 |
| WO | 99/16168 A1 | 4/1999 |

* cited by examiner

*Primary Examiner*—Mark Budd
(74) *Attorney, Agent, or Firm*—Arent Fox LLP

(57) ABSTRACT

A surface acoustic wave device includes at least one interdigital transducer having electrodes of a double-layered structure in which an upper film and an underlying film are laminated. The upper film has a main component of Al and a first metal of Ti added to the main component. The underlying film has a main component of Ti.

4 Claims, 7 Drawing Sheets

Al-0.15wt%Ti-0.5wt%Cu/Ti (PRESENT INVENTION)

Al-1%Cu/Ti (CONVENTIONAL)

SURFACE ACOUSTIC WAVE DEVICE

BACKGROUND OF THE INVENTION

1. Field of the Invention

This invention generally relates to techniques of surface acoustic wave devices, and more particularly, to a technique that enables to enhance the power durability, lower the resistance, and lower the cost of a surface acoustic wave duplexer.

2. Description of the Related Art

A surface acoustic wave device as represented by a surface acoustic wave (hereinafter referred to as SAW) filter is widely employed for a mobile communication device such as a mobile telephone or the like. Particularly, in recent years, a dielectric element on an antenna duplexer has been increasingly replaced by the SAW device, for the purpose of downsizing and making the mobile communication device thinner. The antenna duplexer is used for separating transmission signals from reception signals. A great power is applied to the antenna duplexer, and accordingly it is considered essential that the SAW device used in the antenna duplexer has high power durability. The development has been made in order to enhance the power durability of the SAW device.

If an excessive power is applied to an interdigital transducer (IDT) that excites or receives a surface acoustic wave, a stress migration and an electromigration will be caused in an electrode of the IDT. The electrode is damaged by the migrations depending on the electrode material. This degrades the characteristics of the SAW device. Therefore, it can be said that the power durability of the SAW device is largely dependent on the material of the electrodes in the IDT. Under the above-mentioned background, the development of the electrode material for the SAW device has been made actively.

The results of the development of the conventional electrode material are classified as follows, according to the principle thereof. In a first method, a metal other than Al is added to Al in order to enhance the strength of the electrode material (refer to Japanese Patent Application Publication No. 62-163408 and Japanese Patent Application Publication No. 64-80113). In this method, a metal element such as Cu, Ti, Ni, Mg, Pd, or the like that can improve the migration resistance characteristics (power durability) is added to Al of the main electrode material in order to enhance the strength of the electrode material.

In a second method, the crystal grain size of Al, which is the electrode material, is reduced to produce a large number of crystal grain boundaries so that the stress applied to the electrode may be released structurally (refer to Japanese Patent Application Publication No. 8-32404 and Japanese Patent Application Publication No. 8-148966). In this method, two or three given elements are added to Al of the main electrode material to reduce the size of the grains and produce a large number of the crystal grain boundaries so that the stress may be dispersed for improving the power durability.

In a third method, a double-layered structure having an electrode layer of Al provided on a thin underlying film is employed so that the crystalline orientation of the electrode layer of Al may be made in one direction, or a single crystal of Al is employed. The mechanical strength of the electrode is thus enhanced (refer to Japanese Patent Application Publication No. 5-90268, Japanese Patent Application Publication No. 10-93368, and International Publication WO99/16168). Specifically, a thin film of Ti or Cr is formed on a piezoelectric substrate, and then the electrode layer of Al, which is the main electrode material, is formed to be oriented in a certain crystal orientation in order to enhance the power durability of the electrode layer of Al.

In a fourth method, the electrode is configured to employ a laminated structure having three or more layers in order to enhance the strength of the electrode (refer to Japanese Patent Application Publication No. 4-288718, Japanese Patent Application Publication No. 9-223944, Japanese Patent Application Publication No. 7-122961, U.S. Pat. No. 5,909, 156, Reissue Application No. 38278, and Reissue Application No. 38002). Specifically, a multilayered electrode structure having three or more layers is employed to include the underlying film, a film having a main component of Al, and a metal film other than Al. The mechanical strength is thus improved.

Today, however, it is difficult to satisfy the characteristic demands for the SAW device (mainly three points, to enhance the power durability, lower the resistance, and lower the costs) with the above-mentioned first through fourth methods. A description will be given of the reasons. The conventional frequency band of the SAW device has been mainly 800 MHz to 1 GHz. However, the frequency band of 1.8 to 2 GHz is mainly used these days. This means that the frequency band becomes almost double these days. This reduces the width of the electrode finger and the gap between the electrode fingers of the IDT to half or less of the conventional one, and also reduces the thickness of the electrode film to half or less. As the electrode finger becomes smaller, the power durability is degraded. Therefore, the power durability of the electrode material itself has to be enhanced more. In addition, the width of the electrode finger and the thickness of the electrode film are respectively reduced to half or less, and a cross-sectional area of the electrode becomes one forth or less and an electric resistance thereof is accordingly increased four times or more. If the electric resistance is increased, the pass band characteristics of the SAW device will be degraded. Therefore, it is necessary to avoid the increase in the electric resistance as much as possible. Moreover, the spread of the mobile communication devices promotes to lower the cost thereof, and accordingly the cost of the SAW device has to be lowered. Here, a description will be given of the studies that have been made whether the above-mentioned first through fourth methods are capable of satisfying the above-mentioned demands.

First, the electrode has a single-layered structure in the first and second methods. A substantial amount of a metallic element other than Al has to be added to Al of the main electrode material in order to obtain sufficient power durability. However, thus added metallic element results in an increase in the electric resistance.

In addition, with respect to the third method, the sufficient power durability is not obtainable by only providing the Al film having the high orientation on the extremely thin underlying film. As described in Japanese Patent Application Publication No. 2002-368568, the characteristic demands can be satisfied with only a thick underlying film, which is formed to have a high film thickness ratio to the whole electrode. However, an electrical resistivity of Ti, which is often used for the underlying film, is approximately 20 times higher than that of Al, the main electrode material. If the Ti underlying film is thick, the electrical resistivity of the electrode will be increased.

Further, the fourth method employs the multilayered structure having three or more layers. This makes an electrode forming process (such as film forming and etching) complicated and increases the cost. Also, the ratio of Al of the main electrode material having a relatively low resistance is decreased, which increases the electrical resistivity of the electrode.

As described, it is difficult to provide the SAW device that can satisfy the demands of enhancing power durability, lowering the resistance, and lowering the cost all together, with the conventional techniques.

SUMMARY OF THE INVENTION

The present invention has been made in view of the above circumstances and provides a surface acoustic wave device having an electrode structure that enables to enhance power durability, lower the resistance, and lower the cost all together.

According to an aspect of the present invention, preferably, there is provided A surface acoustic wave device including: at least one interdigital transducer having electrodes of a double-layered structure in which an upper film and an underlying film are laminated, the upper film having a main component of Al and a first metal of Ti added to the main component, the underlying film having a main component of Ti.

According to another aspect of the present invention, a surface acoustic wave duplexer may include the above-mentioned surface acoustic wave device.

BRIEF DESCRIPTION OF THE DRAWINGS

Preferred embodiments of the present invention will be described in detail with reference to the following drawings, wherein.

DESCRIPTION OF THE PREFERRED EMBODIMENTS

A description will now be given, with reference to the accompanying drawings, of embodiments of the present invention. A SAW device in accordance with the present invention is mounted on a ceramic package or the like, and the device and the package are connected by wires or bumps. The aforementioned package may be made other than ceramic, and may be sealed with plastic so as to secure a space arranged on a surface of the device. The aforementioned device may be packaged as a single unit, or may be mounted on a module substrate with other discrete parts.

Figure 1:
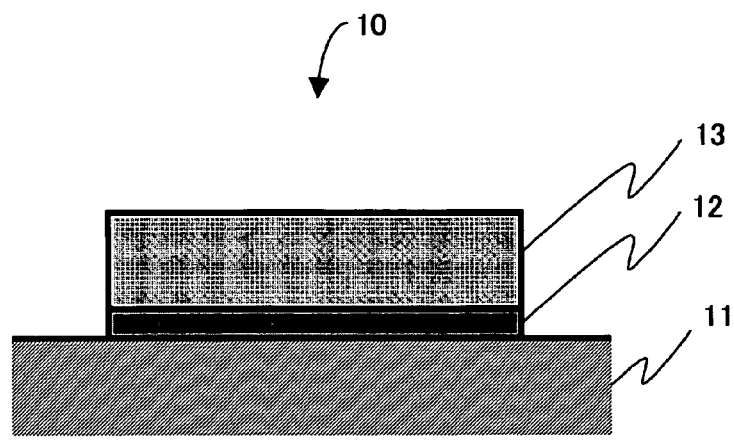
FIG. 1 is a view illustrating a structure of an electrode provided in a SAW device in accordance with the present invention.

FIG. 1 is a view illustrating an exemplary structure of an electrode provided in the SAW device in accordance with the present invention. An electrode 10 has a double-layered structure in which an underlying film 12 of Ti and an upper film 13 of Al—Ti are sequentially laminated on a piezoelectric substrate 11. The upper film 13 (Al—Ti) has a composition in which Ti (a first metal) is added to the main electrode substance of Al. Here, a description will be given of the reason why the electrode of the present invention employs the double-layered structure. The double-layered structure is considered most suitable for satisfying all the demands of enhancing the power durability, lowering the resistance, and lowering the cost among the above-mentioned first through fourth methods. This is because a substantial amount of additive has to be added to the main electrode material of Al so that the sufficient power durability may be obtained with the single-layered structure described in the first and second methods. This results in an increase in the electric resistance. If the multilayered structure having at least three layers is employed as described in the fourth method, the film forming process and the etching process of the electrode film are respectively performed times equal in number to the layers. This makes the production process complicated. Also, the precise control is required to regulate the thickness of each layer, leading to the degradation of the yield ratio. Thus, it is considered difficult to lower the cost. However, as described above, even if the structure is merely double-layered, it is still difficult to satisfy the above-mentioned three demands all together.

The electrode 10 has the double-layered structure in accordance with the present invention. The underlying film 12 of Ti and the upper film 13 of Al—Ti are sequentially laminated. Ti is added to the main electrode material of Al in the upper film 13. The metal to be added to Al that is the main electrode material of the upper film 13 is the same as the constituting element of the underlying film 12.

Conventionally, it has been well known that the upper film is formed by adding several weight percent of Cu to the main electrode material of Al (for example, as described in Japanese Patent Application Publication No. 2002-368568). Generally, it is difficult to etch Cu with RIE (Reactive Ion Etching). Therefore, it is required to employ the RIE conditions of the Al—Cu upper film including several weight percent of Cu different from those of the Ti underlying film, and this complicates the production process.

Figure 2:
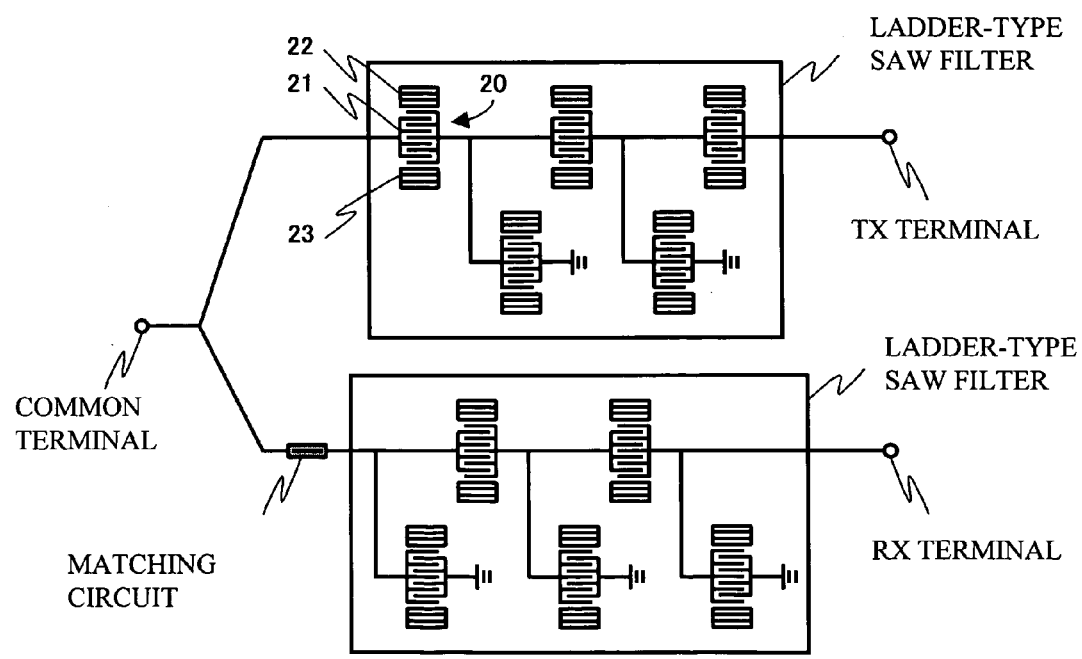
FIG. 2 shows a duplexer having ladder-type SAW filters in both transmission and reception.
Figure 3:
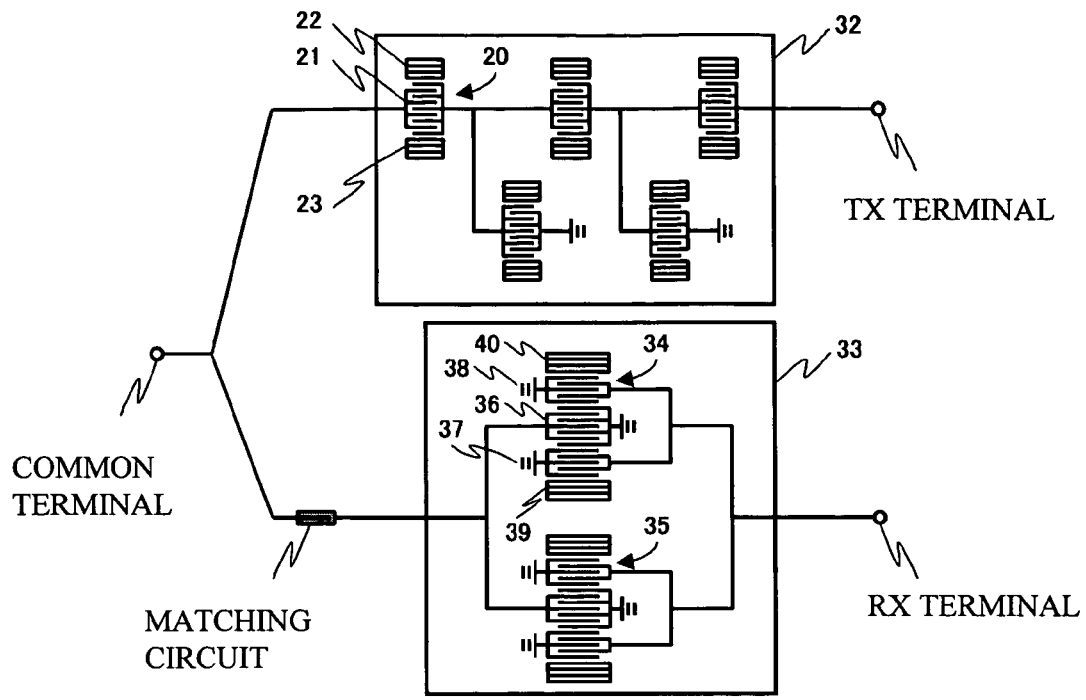
FIG. 3 shows a duplexer having a ladder-type SAW filter and a longitudinally-coupled double-mode SAW filter.
Figure 4:
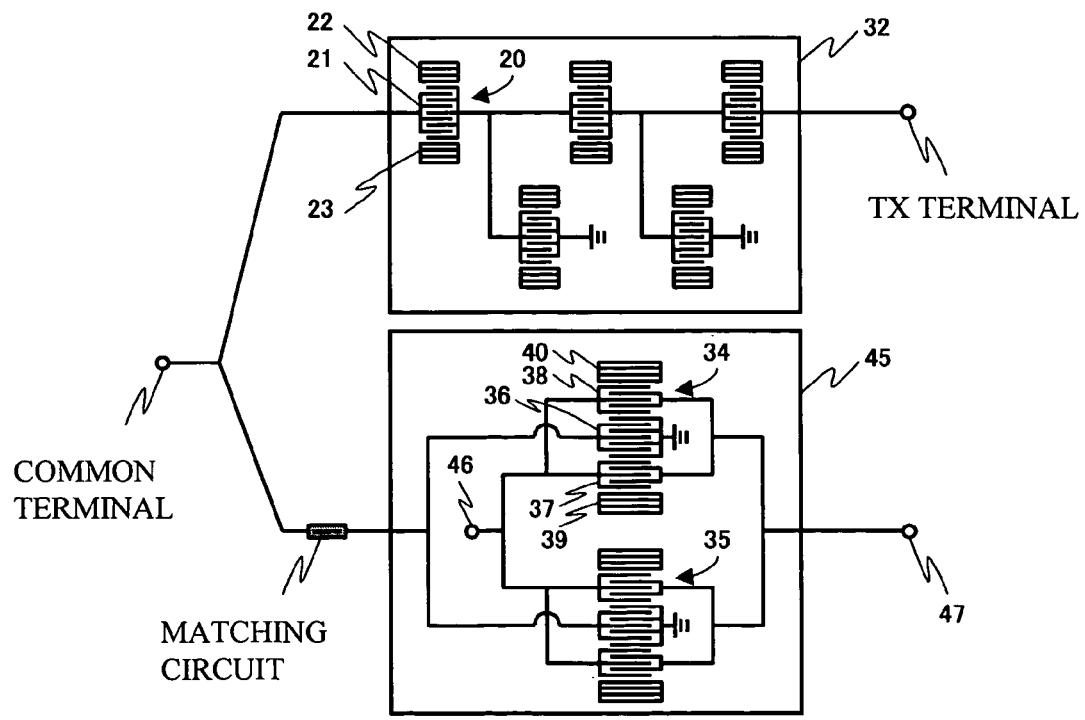
FIG. 4 shows a duplexer configured so that the reception filter in the duplexer shown in FIG. 3 may serve as a balanced (differential) output filter.

In contrast, if the upper film 13 is formed by adding Ti that is also the constituting or main element of the underlying film 12 to the main electrode material of Al, both Al and Ti can be etched by the RIE with chlorine gas. Thus, a continuous one-time RIE can be used to form the electrode fingers of the double-layered structure composed of the Ti underlying layer 12 and the Al—Ti upper layer 13 without changing the RIE conditions. It is thus possible to lower the cost, contrary to the production of the conventional electrode, in which the upper film is formed by adding a metal element such as Cu, for example, to the main electrode material of Al. In the conventional electrode, the added metal element is different from the constituting element Ti of the lower film. FIGS. 2 through 4 show duplexers including filters equipped with the IDTs, in which the above-mentioned electrodes (electrode fingers) are provided.

FIG. 2 shows a duplexer having ladder-type SAW filters arranged in both the transmission and reception systems. Each of the ladder-type SAW filters is composed of resonators 20, each of which is a single-port SAW resonator and is made up of an IDT 21, and reflectors arranged on both sides of the IDT 21.

The duplexer as shown in FIG. 3 includes a ladder-type SAW filter 32 and a longitudinally-coupled double-mode SAW filter 33. The ladder-type SAW filter 32 is a transmission filter of the duplexer and the longitudinally-coupled double-mode SAW filter 33 is a reception filter of the duplexer. The filters 32 and 33 have different center frequencies. One end of the ladder-type SAW filter 32 is connected to a common terminal, and the other end thereof is connected to a transmission terminal. In the same manner, one end of the longitudinally-coupled double-mode SAW filter 33 is connected to the common terminal via a matching circuit, and the other end thereof is connected to a reception terminal. Here, the transmission filter is the ladder-type SAW filter 32 in which multiple one-port SAW resonators 20 are connected in a ladder, while the reception filter is composed of the longitudinally-coupled double-mode SAW filter 33. Here, the ladder-type SAW filter 32 is the transmission filter and the longitudinally-coupled double-mode SAW filter 33 is the reception filter. The reception filter 33 includes multiple double-mode SAW filters (two double-mode SAW filters 34 and 35, hereinafter referred to as DMS (Double Mode SAW) filter) connected in parallel. Each of the DMS filters 34 and 35 includes three interdigital transducers (hereinafter referred to as IDT) 36, 37, and 38 and two reflectors 39 and 40. The reference numerals of the elements are omitted in the DMS filter 35 for simplification. The IDTs 36, 37, and 38 are adjacently arranged in a propagation direction. The reflectors 39 and 40 are grating reflectors, which are respectively arranged adjacently to the IDTs 37 and 38. The DMS filter 35 is configured in the same manner as the DMS filter 34. The two DMS filters 34 and 35 are connected in parallel as follows. One of comb-like electrodes of the IDT 36 in the DMS filter 34 and one of the comb-like electrodes of the IDT 36 in the DMS filter 35 are commonly connected, and are also connected to one end of the matching circuit. The other comb-like electrodes of the IDTs 36 of the DMS filters 34 and 35 are grounded. One of the comb-like electrodes of the IDT 37 and one of the comb-like electrodes of the IDT 38 in the DMS filter 34 are commonly connected, and are also connected to one of the comb-like electrodes of the IDT 37 connected to one of the comb-like electrodes of the IDT 38 in the DMS filter 35, and are then commonly connected to the reception terminal. The other comb-like electrodes of the IDTs 37 and IDTs 38 in the DMS filters 34 and 35 are grounded.

The duplexer shown in FIG. 4 is configured so that the filter 33 in the duplexer shown in FIG. 3 may serve as a balanced (differential) output filter. This filter is shown as a reception filter 45 in FIG. 4. Here, as shown in FIG. 4, the grounded comb-like electrodes of the IDTs 37 in FIG. 3 are connected to each other in the DMS filters 34 and 35, and are also connected to a newly provided reception terminal 46. A balanced output is available through the reception terminal 46 and another reception terminal 47.

The results of experiments conducted by the inventors exhibit that, as compared to the conventional double-layered electrode structure of Al—Cu/Ti, the power durability can be enhanced significantly by adding a small amount of Ti to the main electrode material of Al of the upper film 13, if the double-layered electrode structure having the underlying film 12 of Ti is employed. The conventional double-layered electrode structure of Al—Cu/Ti includes the Al—Cu upper film, in which Cu is added to Al. In the experiments carried out by the inventors, the ratio of the thickness of the Ti underlying film to the whole electrode structure was set equal to 24 percent in the whole film thickness in both of the electrode structure of the present invention and the conventional electrode structure. The composition of the upper film in the conventional electrode was Al-0.5 wt % Cu. The composition of the Al—Ti upper film was Al-0.15 wt % Ti. In this manner, the upper films of the two electrode structures had approximately equal electric resistances.

Two types of ladder-type SAW filters that have four stages and a pass band in the 1.9 GHz band were prepared by using the above-mentioned two different electrodes, respectively. Then, the power durability of the SAW filters was evaluated. The power durability was evaluated in such a manner that a power of 1.2 W (constant wave) was applied to the high-frequency edge of the 3.5 dB pass band under an ambient temperature of 85° C., and the life until the 3.5 dB pass band width was reduced by five percent was measured. The evaluation results showed that the ladder-type SAW filter having the double-layered electrode of Al-0.15 wt % Ti/Ti in accordance with the present invention has the life equal to or longer than five times of the conventional ladder-type SAW filter having the double-layered electrode of Al-0.5 wt % Cu/Ti. In other words, it was confirmed the power durability equal to or more than five times is obtainable, although the added amount of Ti to the main electrode material Al in the upper film is only at most one third of the added amount of Cu in the conventional electrode. Also, the evaluation results showed that it is very effective in improving the power durability by adding Ti to the upper film of Al in the double-layered structure having the underlying film of Ti. The experimental results showing the improved power durability brought about by adding Ti are inversely related to the test results of the power durability of the conventional single-layered electrode structure (refer to Table 1 in Japanese Patent Application Publication No. 6-6173). That is, the above-mentioned fact is the knowledge of the inventors found out for the first time. However, it should be noted that, if Ti is added to Al too much, the electric resistance of the electrode will increase drastically.

Figure 5:
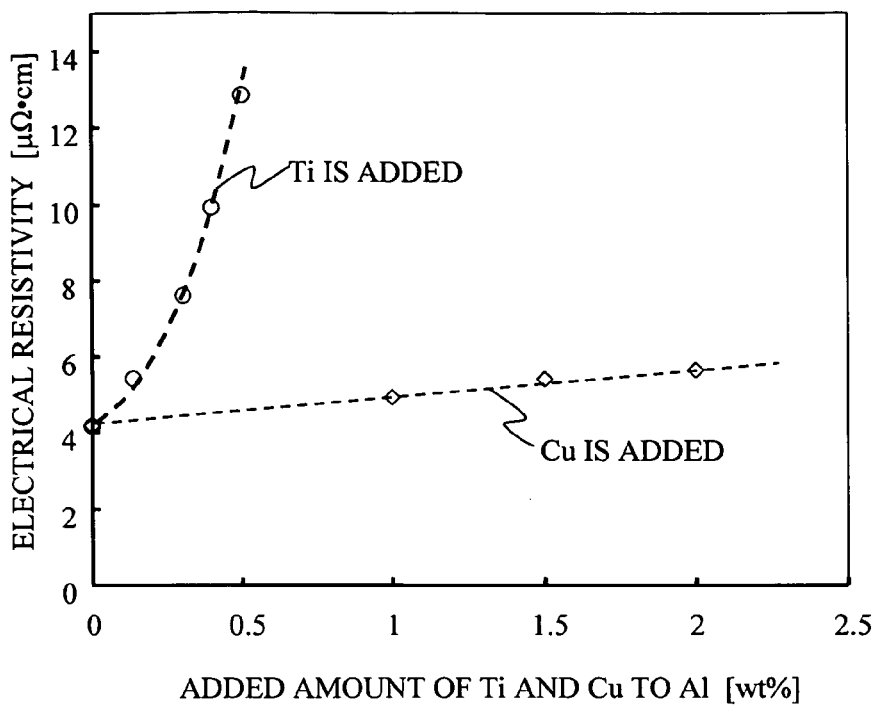
FIG. 5 is a graph showing how the electrical resistivity of the electrode changes when Ti or Cu is added to Al of the main electrode material in the upper film.

FIG. 5 is a graph showing how the electrical resistivity of the electrode changes when Ti or Cu is added to Al of the main electrode material in the upper film. Here, the electrode has the double-layered structure, and the underlying film of Ti has the thickness ratio of 24 percent in the whole thickness. This graph shows that the increasing rate is extremely high in the electrical resistivity of the electrode when Ti is added, as compared to when Cu is added. Even when a small amount of Ti is added, the electrical resistivity of the electrode will be increased drastically. However, as described before, if the electrode has the double-layered structure having the Ti underlying film and the Al—Ti upper film, the power durability can be enhanced five times or more by adding Ti that is as much as only at most one third of the amount of Cu to be added. That is to say, the use of Ti improves the power durability 15 times or more as compared to the power durability obtained when Cu is used. Accordingly, it is enough to add only a small amount of Ti, and the drawback of the increase in the electrical resistivity can be avoided by appropriately selecting the added amount (and the thickness). The inventors have found out that if the concentration of Ti to be added the main electrode material of Al in the upper film is set equal to at most 0.4 wt %, the electrical resistivity of the electrode can be lowered to at most 10 $\mu\Omega$·cm.

Figure 6:
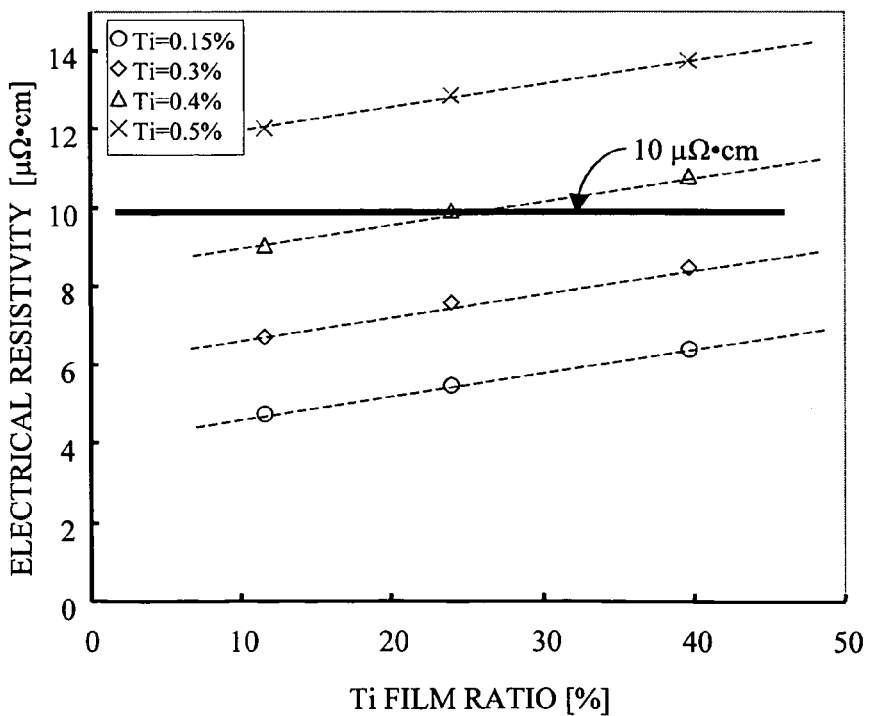
FIG. 6 is a graph showing changes of the specific resistance as a function of the thickness of the underlying film of Ti for several different concentrations of Ti contained in the upper film of the electrode used for the SAW device having the pass band of 1.8 to 2 GHz, in which the electrode has a thickness of 180 nm when it is the single layer of Al.

FIG. 6 is a graph showing changes of the electrical resistivity as a function of the thickness of the underlying film of Ti for several different concentrations of Ti contained in the upper film of the electrode used for the SAW device having the pass band of 1.8 to 2 GHz. The electrode has a thickness of 180 nm when it is the single layer of Al. When the thickness of the underlying film is changed, the thickness of the upper film is also changed in order to keep the mass of the whole electrode constant. Here, preferably, the electrode has the electrical resistivity of at most 10 $\mu\Omega$·cm to produce a good SAW device. Also, if the ratio of the thickness of the Ti underlying film to the whole thickness of the electrode is limited to at most 50 percent so that Al may be the main component of the whole electrode, the concentration of Ti has to be at most 0.4 wt % as shown in FIG. 6.

Figure 7:
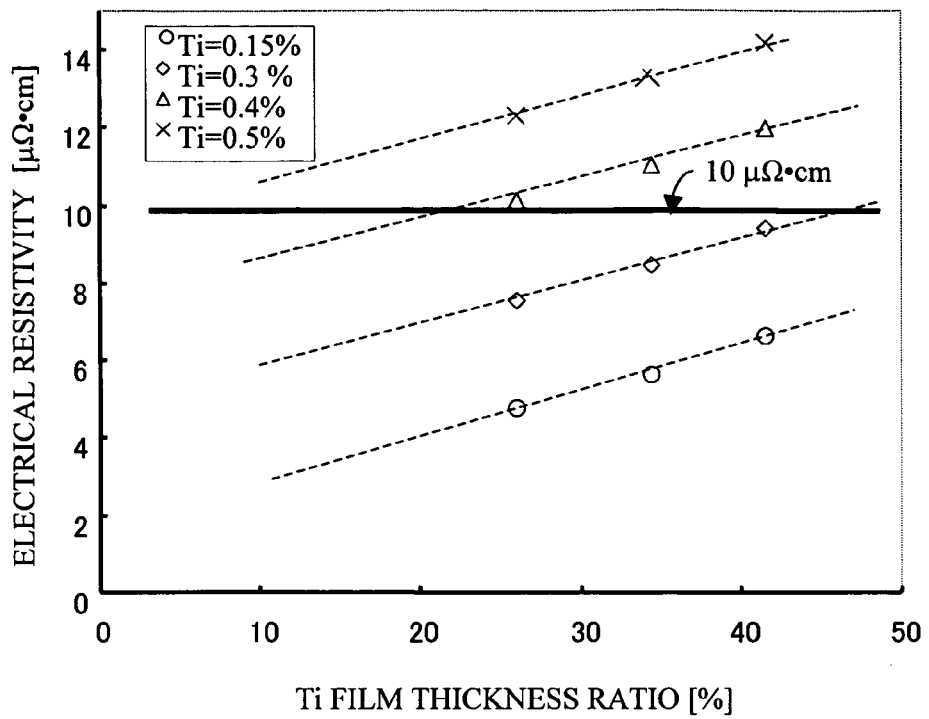
FIG. 7 is a graph showing changes of the electrical resistivity as a function of the thickness of the underlying film of Ti for several different concentrations of Ti contained in the upper film of the electrode used for the SAW device having the pass band of 0.8 to 1 GHz in which the electrode has a thickness of 430 nm when it is the single layer of Al.

FIG. 7 is a graph showing changes of the electrical resistivity as a function of the thickness of the underlying film of Ti for several different concentrations of Ti contained in the upper film of the electrode used for the SAW device having the pass band of 0.8 to 1 GHz. The electrode has a thickness of 430 nm when it is the single layer of Al. FIG. 7 shows that it is possible to lower the electrical resistivity to 10 $\mu\Omega$·cm or lower, if the concentration of Ti is set equal to 0.4 wt % or less. That is to say, if the concentration of Ti is at most 0.4 wt % in the upper film, it is possible to produce the SAW device having the good power durability and low resistance. As long as the SAW device is produced under the above-mentioned conditions, there is no need for the annealing process for lowering the resistance as described in Japanese Patent Application Publication No. 5-206776. It is thus possible to decrease the resistance of the electrode at a low cost.

Additionally, according to the experiments performed by the inventors, Ti (the first metal) is not the only metal to be added to the upper film of Al. A small amount of a second metal may be added rather than the first metal of Ti. The inventors found out that the electrode can be formed without changing the RIE conditions, if the weight percent of the second metal is 0.5 wt % or less. That is, it is possible to improve the power durability more by adding at most 0.5 wt % of the second metal to Al. As the second metal, Mg or Cu is effective, because Mg or Cu can enhance the power durability and does not drastically increase the resistance when added to Al.

Further, if the concentration of Ti and that of the second metal to be added to Al are respectively set to 0.3 wt % or less, the power durability can be further enhanced and the resistance can be further lowered. More preferably, if the amount of Ti added to the upper film is set to 0.3 wt % or less, the specific resistance is equal to 10 $\mu\Omega$·cm or less within a substantially overall range of 0 to 50 percent in the thickness ratio of the Ti underlying film, as shown in FIGS. 6 and 7. This makes the design more flexible in the ratio of the thickness of the Ti underlying film and the amount of Ti added to the upper film.

A description will be given of embodiments.

First Embodiment

The first embodiment is a ladder-type SAW filter that has four stages and a 1.9 GHz pass band and employs a 42° Y-cut X-propagation LiTaO$_3$ substrate. The electrode of this filter has the double-layered structure of Al-0.15 wt % Ti/Ti, and the Ti underlying film has a thickness ratio of 24 percent. For comparison, there is provided another ladder-type SAW filter that includes the conventional electrode having the upper film of Al-0.5 wt % Cu. These filters were produced by a continuous one-time RIE process without changes of the RIE conditions on the upper film and the Ti underlying film.

Figure 8:
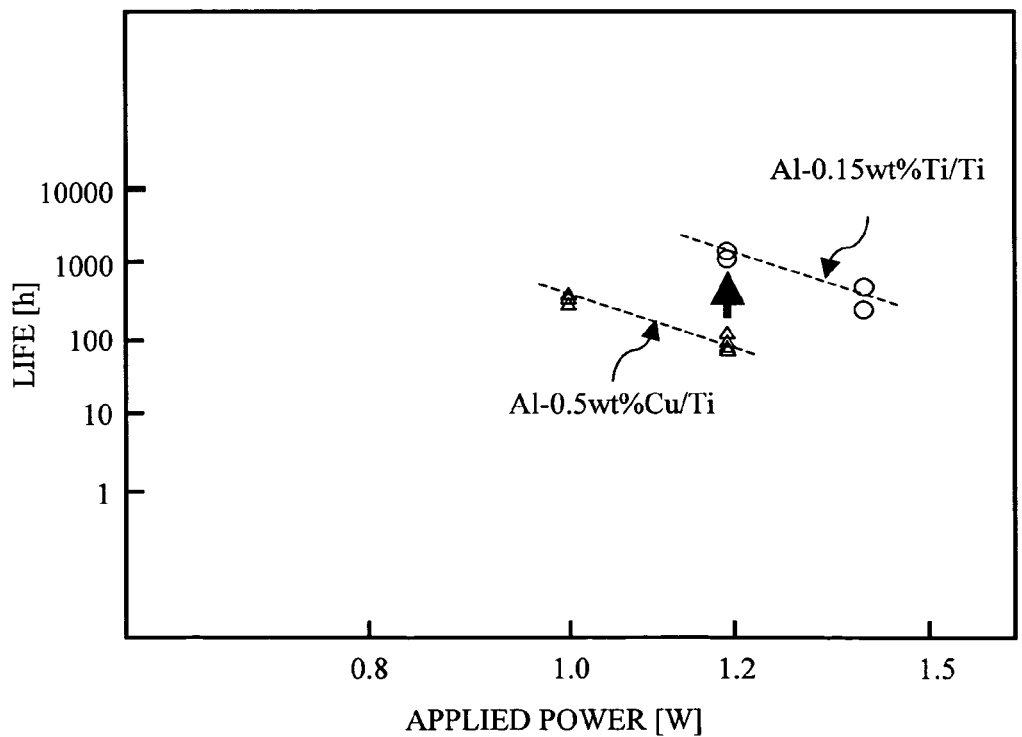
FIG. 8 is a graph showing the evaluation results of the power durability of a ladder-type SAW filter having four stages in accordance with a first embodiment of the present invention.

FIG. 8 is a graph showing the results of evaluation of the power durability of the above two ladder-type SAW filters having four stages. The horizontal axis of FIG. 8 denotes the electric power (W) applied to the high-frequency edge of the 3 dB pass band. The vertical axis denotes the time (life: h) in which the 3 dB pass band width is degraded by only five percent with the aforementioned power applied. As shown in FIG. 8, the ladder-type SAW filter of four stages including the electrode having the double-layered structure of Al-0.15 wt % Ti/Ti in accordance with the present embodiment has an approximately single-digit increase (ten times increase) in life, as compared to the conventional ladder-type SAW filter of the conventional electrode (having the double-layered structure of Al-0.5 wt % Cu/Ti). The improved power durability is thus realized.

Second Embodiment

The second embodiment is a ladder-type SAW filter has four stages and an 800 MHz pass band and employs a 42° Y-cut X-propagation LiTaO$_3$ substrate. The electrode of this filter is the double-layered structure of Al-0.15 wt % Ti-0.3 wt % Cu/Ti, and the Ti underlying film has a thickness ratio of 42 percent. For comparison, there is provided another ladder-type SAW filter that includes the conventional electrode having the upper film of Al-0.5 wt % Cu. These filters were produced by a continuous one-time RIE process without changes of the RIE conditions on the upper film or the Ti underlying film.

Figure 9:
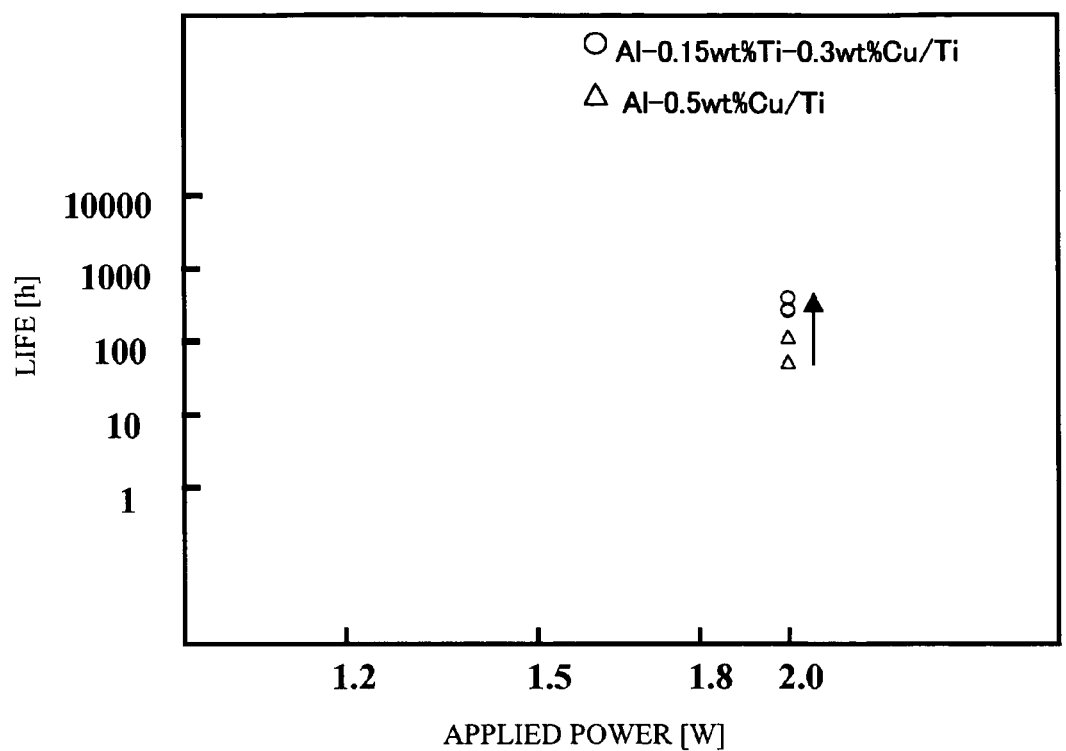
FIG. 9 is a graph showing the evaluation results of the power durability of a ladder-type SAW filter having four stages in accordance with a second embodiment of the present invention.

FIG. 9 is a graph showing the results of evaluation of the power durability of the above two ladder-type SAW filters having four stages. The vertical axis of FIG. 9 denotes the time (life: h) in which the 3 dB pass band width is degraded by only five percent while the power (constant wave) is being applied to the high-frequency edge of the 3 dB pass band. As shown in FIG. 9, the ladder-type SAW filter of four stages including the electrode having the double-layered structure of Al-0.15 wt % Ti-0.3 wt % Cu/Ti in accordance with the present embodiment has an approximately five times longer life (when 2.0 W power is applied) than the conventional ladder-type SAW filter of the conventional electrode (having the double-layered structure of Al-0.5 wt % Cu/Ti). The improved power durability is thus realized.

Third Embodiment

The third embodiment is a multimode SAW filter having a 1.9 GHz pass band and employs a 42° Y-cut X-propagation LiTaO$_3$ substrate. The electrode of this filter is the double-layered structure of Al-0.15 wt % Ti-0.5 wt % Cu/Ti, and the Ti underlying film has a thickness ratio of 24 percent. For comparison, there is provided another multimode SAW filter that includes the conventional electrode having the upper film of Al-1 wt % Cu. These filters were produced by a continuous one-time RIE process without changes of the RIE conditions on the upper film or the Ti underlying film.

Figure 10A:
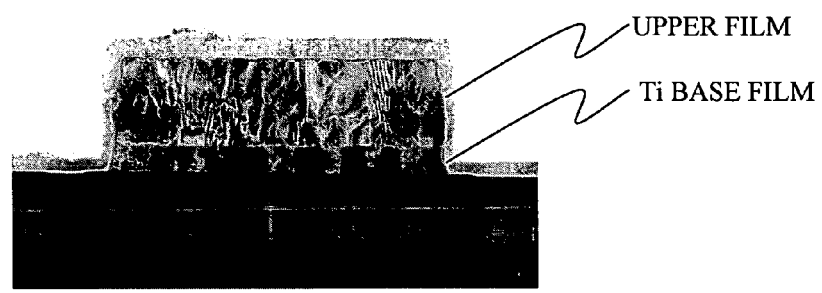
FIGS. 10A and 10B are transmission electron microscope images showing cross-sectional areas of the electrodes included in the two kinds of the ladder-type SAW filters.
Figure 10B:
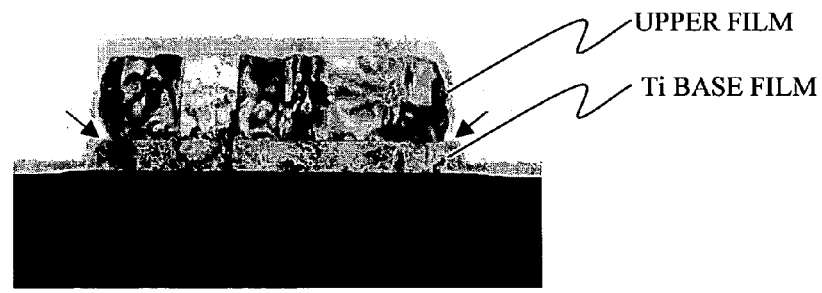

FIGS. 10A and 10B are transmission electron microscope images (TEM images) showing cross-sectional areas of the electrodes included in the two different multimode SAW filters. More specifically, FIG. 10A is a cross-sectional TEM image of the electrode having the double-layered structure of Al-0.15 wt % Ti-0.5 wt % Cu/Ti included in the multimode SAW filter in accordance with the present embodiment of the present invention. FIG. 10B is a cross-sectional TEM image of the conventional electrode having the double-layered structure of Al-1 wt % Cu/Ti.

The etching rates are different in the upper film having much Cu (1 wt %) and the Ti underlying film, in the conventional electrode having the double-layered structure of Al-1 wt % Cu/Ti. As shown in FIG. 10B, there is a dented portion at the interface between the upper film and the underlying film. In contrast, as shown in FIG. 10A, there is no dented portion at the interface between the upper film and the underlying film of the electrode having the double-layered structure of Al-0.15 wt % Ti-0.5 wt % Cu/Ti in accordance with the present embodiment of the present invention, which electrode has an ideal cross section. Also, it has been found out that the shape of the electrode without any dented portions is obtainable if the second metal of Cu added to the upper film is 0.5 wt % or less.

Figure 11:
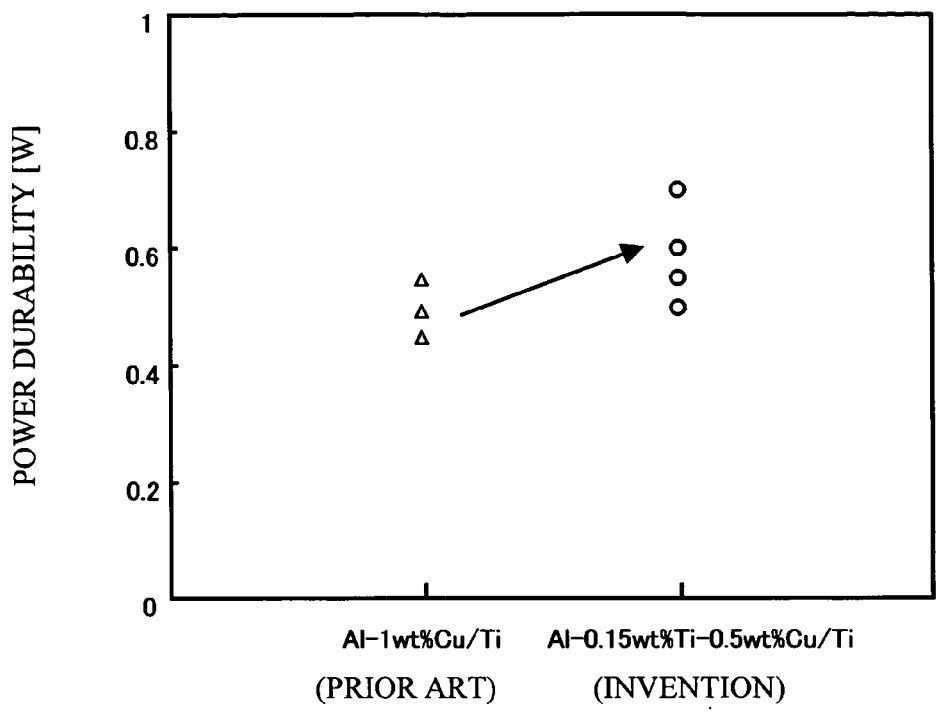
FIG. 11 is a graph showing the evaluation results of the power durability of a multimode SAW filter having four stages in accordance with a third embodiment of the present invention.

FIG. 11 is a graph showing the results of evaluation of the power durability of the above-mentioned two multimode SAW filters. The vertical axis of FIG. 11 denotes the power durability (W) in which the 4 dB pass band width is degraded by only five percent, when a power (constant wave) of 0.1 W is applied to the low-frequency edge of the 4 dB pass band and the applied power is increased by 0.05 W every five minutes. As shown in FIG. 11, the multimode SAW filter including the electrode having the double-layered structure of Al-0.15 wt % Ti-0.5 wt % Cu/Ti in accordance with the present embodiment has a 1.2 times longer life than the conventional multimode SAW filter of the conventional electrode (having the double-layered structure of Al-1 wt % Cu/Ti). The improved power-durability is thus realized.

Fourth Embodiment

The fourth embodiment is a ladder-type SAW filter that has four stages and a 1.9 GHz pass band and employs a 42° Y-cut X-propagation LiTaO$_3$ substrate. The electrode of this filter is the double-layered structure of Al-0.3 wt % Ti/Ti, and the Ti underlying film has a thickness ratio of 12 percent. For comparison, there is provided another ladder-type SAW filter that includes the conventional electrode having the upper film of Al-0.5 wt % Cu.

Figure 12:
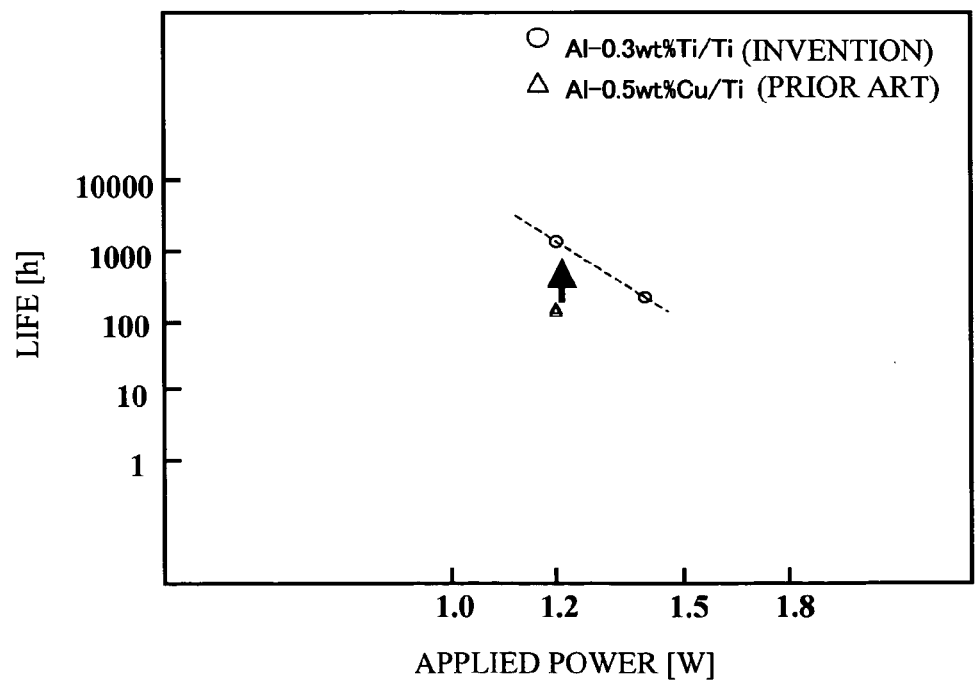
FIG. 12 is a graph showing the evaluation results of the power durability of a ladder-type SAW filter having four stages in accordance with a fourth embodiment of the present invention.

FIG. 12 is a graph showing the results of evaluation of the power durability of the two ladder-type SAW filters having four stages. The vertical axis denotes the time (life: h) in which the 3.5 dB pass band width is degraded by only five percent while the power (constant wave) is being applied to the high-frequency edge of the 3.5 dB pass band. As shown in FIG. 12, the ladder-type SAW filter of four stages including the electrode having the double-layered structure of Al-0.3 wt % Ti/Ti in accordance with the present embodiment has an approximately single-digit increase (ten times increase) in life, as compared to the conventional ladder-type SAW filter of the conventional electrode (having the double-layered structure of Al-0.5 wt % Cu/Ti). The improved power durability is thus realized.

It is thus possible to provide the surface acoustic wave device having the electrode structure that enables to enhance power durability, lower the resistance, and lower the cost all together.

The present invention is not limited to the above-mentioned embodiments, and other embodiments, variations and modifications may be made without departing from the scope of the present invention.

The present invention is based on Japanese Patent Application No. 2004-162611 filed on May 31, 2004, the entire disclosure of which is hereby incorporated by reference.

What is claimed is:

1. A surface acoustic wave device comprising:
   at least one interdigital transducer having electrodes of a double-layered structure in which an upper film and an underlying film are laminated,
   the upper film having a main component of Al and a first metal of Ti added to the main component: and
   the underlying film having a main component of Ti, wherein
   a concentration of Ti in the upper film is 0.4 wt % or less,
   a resistance of the electrodes is 10 μΩ·cm or less, and
   the upper film includes a second metal of Mg or Cu added thereto, the second metal having a concentration of 0.5 wt % or less.

2. The surface acoustic wave device as claimed in claim 1, wherein:
   the first metal has a concentration of 0.3 wt % or less; and
   the second metal has a concentration of 0.3 wt % or less.

3. The surface acoustic wave device as claimed in claim 1, wherein:
   the second metal is Cu;
   the concentration of the first metal is 0.15 wt %; and
   the concentration of the second metal is 0.5 wt %.

4. A surface acoustic wave duplexer comprising a surface acoustic wave device comprising:
   at least one interdigital transducer having electrodes of a double-layered structure in which an upper film and an underlying film are laminated,
   the upper film having a main component of Al and a first metal of Ti added to the main component: and
   the underlying film having a main component of Ti, wherein
   a concentration of Ti in the upper film is 0.4 wt % or less,
   a resistance of the electrodes is 10 μΩ·cm or less, and
   the upper film includes a second metal of Mg or Cu added thereto, the second
   metal having a concentration of 0.5 wt % or less.

* * * * *